United States Patent
Kobayashi et al.

(10) Patent No.: US 6,927,337 B2
(45) Date of Patent: Aug. 9, 2005

(54) ELECTRONIC CONTROL UNIT FOR USE IN AUTOMOTIVE VEHICLE

(75) Inventors: Toshiki Kobayashi, Okazaki (JP); Hajime Katsuro, Nagoya (JP); Yukihiro Kato, Nagoya (JP); Toshio Fujimura, Okazaki (JP); Toru Murowaki, Chiryu (JP); Yutaka Obikane, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/686,645

(22) Filed: Oct. 17, 2003

(65) Prior Publication Data

US 2004/0079543 A1 Apr. 29, 2004

Related U.S. Application Data

(63) Continuation of application No. 10/043,224, filed on Jan. 14, 2002, now Pat. No. 6,717,051.

(30) Foreign Application Priority Data

Feb. 21, 2001 (JP) .......................................... 2001-44884
Feb. 21, 2001 (JP) .......................................... 2001-44885

(51) Int. Cl.$^7$ ............................. H02G 3/08; H05K 5/00
(52) U.S. Cl. ..................................... 174/52.1; 361/752
(58) Field of Search ............................... 439/76.2, 76.1; 361/752; 174/52.1, 59

(56) References Cited

U.S. PATENT DOCUMENTS

| 5,864,091 A | 1/1999 | Sumida |
| 6,300,565 B1 * | 10/2001 | Loibl et al. ................. 174/52.3 |
| 6,315,579 B1 * | 11/2001 | Murakami et al. ......... 439/76.2 |
| 6,407,925 B1 | 6/2002 | Kobayashi et al. |
| 6,430,055 B2 * | 8/2002 | Saito .......................... 361/752 |
| 6,552,911 B1 | 4/2003 | Haupt et al. |
| 2002/0105787 A1 | 8/2002 | Kobayashi et al. |

FOREIGN PATENT DOCUMENTS

| EP | WO 00/70922 | 11/2000 |
| JP | U-58-170882 | 11/1983 |
| JP | U-59-96884 | 6/1984 |
| JP | A-6-318790 | 11/1994 |
| JP | A-7-142878 | 6/1995 |
| JP | A-8-18244 | 1/1996 |
| JP | A-9-62400 | 3/1997 |
| JP | 2000-183551 | 6/2000 |

OTHER PUBLICATIONS

Notice of Rejection issued on Mar. 14, 2005 for Japanese Patent Application No. JP–A–2001–044884.
Notice of Rejection issued on Mar. 14, 2005 for Japanese Patent Application No. JP–A–2001–044885.

* cited by examiner

*Primary Examiner*—Hung V. Ngo
(74) *Attorney, Agent, or Firm*—Posz Law Group, PLC

(57) ABSTRACT

A box-shaped electronic control unit for use in an automotive vehicle includes a pair of side stays for mounting the electronic control unit on a vehicle. The side stay integrally formed with a bottom cover is bent upward to form a bent portion. When electronic control units are carried by a conveyer, they are placed on a conveyer belt so that the bent portions face one another, thereby to avoid overlapping of the electronic control units on the conveyer belt. To form the side stay having a sufficient mechanical strength endurable against a high vibrating force of the vehicle, a pair of ribs extending from both sides of the bottom cover are formed on the side stays.

10 Claims, 7 Drawing Sheets

ELECTRONIC CONTROL UNIT FOR USE IN AUTOMOTIVE VEHICLE

CROSS-REFERENCE TO RELATED APPLICATIONS

This application is a Continuation Application of U.S. patent application Ser. No. 10/043,224 filed Jan. 14, 2002 filed Jan. 14, 2002 now U.S. Pat. 6,717,051, which is based upon and claims benefit of priority of Japanese Patent Applications No. 2001-44884 filed on Feb. 21, 2001 and No. 2001-44885 filed on Feb. 21, 2001, the contents of which are incorporated herein by reference.

BACKGROUND OF THE INVENTION

1. Field of the Invention

The present invention relates to an electronic control unit for use in an automotive vehicle, and more particularly to a casing containing the electronic control unit therein.

2. Description of Related Art

An electronic control unit (referred to as an ECU) for use in an automotive vehicle is composed of a case having a bottom opening, a bottom cover closing the bottom opening and a circuit board contained in an inner space formed by the case and the bottom cover. Side stays are provided at both sides of the bottom cover so that the ECU is mounted on an automotive vehicle via the side stays.

FIG. 7 shows a perspective view, components being separated, of a conventional ECU 50. An ECU casing is composed of a case 51 and a bottom cover 53 closing a bottom opening of the case 51. A circuit board 52 having electronic components thereon is contained in the casing. The case 51, the bottom cover 53 and the circuit board 52 are connected together by common screws 54. Side stays 55 having mounting holes 56 are provided at both sides of the bottom cover 53. The ECU 50 may be directly mounted on a vehicle using the side stays 55, or using a separate bracket connected to the side stays 55.

In an automated line for mounting the ECU on the vehicle, plural ECUs 50 are placed on a conveyer passage 60 as shown in FIG. 8, and they are automatically picked up one by one by a robot arm or the like. When the ECUs 50 are positioned on the conveyer passage 60 in an upright posture (placing one sidewall on the conveyer belt 61, as shown in FIG. 8), it is required to make a proper space between conveyer sidewalls 62 and the ECUs 50. If the space is too large, the ECUs 50 fall on the conveyer belt 61, or the ECUs are not correctly aligned on the conveyer passage 60. On the other hand, if the space is too narrow, the ECUs 50 cannot be smoothly conveyed because sidewalls of the ECUs 50 contact the conveyer sidewalls 62, resulting in a conveyer halt at the worst case.

Further, side stays 55 formed at both sides of one ECU 50 may overlap the side stays 55 of another ECU 50 when ECUs are consecutively conveyed with no space therebetween, as shown in FIG. 8. If this happens, the ECUs 50 contact the conveyer sidewalls 62, thereby being stopped in the conveyer passage 60. The same problem may occur in a conveyer passage in which the ECUs 50 are conveyed in a flat posture.

Another problem in the conventional ECU resides in a mechanical strength of the side stays 55. Since the side stays 55 of the conventional ECU 50 are formed by simply extending the bottom cover 53 in a flat shape, as shown in FIG. 7, its mechanical strength is not sufficiently high to endure high vibration of an automotive vehicle. When the ECU 50 is mounted on a portion where a high vibrating force is imposed, the side stays 55 may be broken.

SUMMARY OF THE INVENTION

The present invention has been made in view of the above-mentioned problems, and an object of the present invention is to provide an ECU which is smoothly carried by an automated conveyer system. Another object of the present invention is to provide an ECU which has mounting stays having a sufficient mechanical strength to endure a high vibrating force of an vehicle.

The ECU is substantially box-shaped and is composed of a case having a bottom opening, a bottom cover closing the bottom opening and a circuit board having electronic components mounted thereon contained in a space formed by the case and the bottom cover. The bottom cover includes a pair of side stays for mounting the ECU on an automotive vehicle. The side stays extend to both sides of the bottom cover, and each side stay includes a bent portion bent upward from a bottom plate of the bottom cover.

The ECUs are placed on a conveyer belt in a conveyer passage, taking an upright posture or a flat posture, so that the bent portion of one ECU directly faces the bent portion of another ECU. Since the bent portions abut one another when ECUs are conveyed in contact with each other, the side stays do not overlap one another. Therefore, the ECUs are smoothly carried by the conveyer without causing jam or halt in the conveyer passage. In most cases, the ECUs are placed on the conveyer belt in an upright posture. In this case, it important to make the height of the bent portion larger than a difference between the width of the conveyer passage and the height of the ECU to prevent overlapping of the ECUs in the conveyer passage. The maximum height of the bent portion may be limited not to exceed the height of fringe walls of the bottom cover, so that plural bottom covers can be stacked up in an assembly process of the ECU.

To enhance mechanical strength of the side stay, a first rib perpendicularly extending from the side of the bottom cover is formed on the side stay. The first rib is also utilized to connect the bottom cover to the case at a right position. In addition, a pair of second ribs are formed along both sides of the bottom cover. The second ribs are positioned inside the ECU when the bottom cover is connected to the case to prevent dusts or foreign particles from entering into the ECU. The bent portion of the side stay may be eliminated if it is not necessary, and only the first rib and/or the second rib may be formed to enhance the mechanical strength of the side stay, so that the side stay is able to endure a high vibrating force of an automotive vehicle.

Other objects and features of the present invention will become more readily apparent from a better understanding of the preferred embodiment described below with reference to the following drawings.

DETAILED DESCRIPTION OF THE PREFERRED EMBODIMENT

Figure 1:
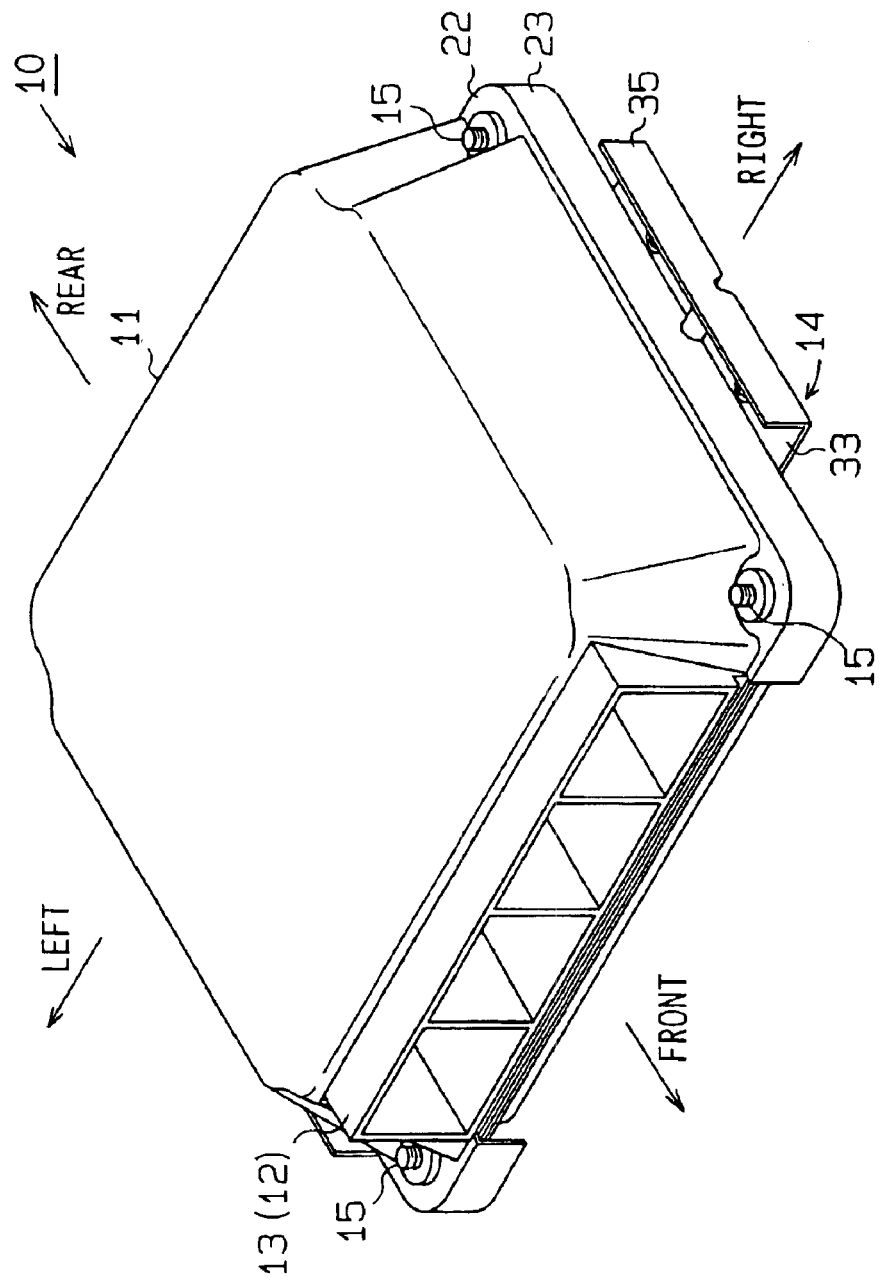
FIG. 1 is a perspective view showing an electronic control unit according to the present invention.

A preferred embodiment of the present invention will be described with reference to the accompanying drawings. First referring to FIGS. 1 and 2, a structure of an ECU 10 will be described. A casing of the ECU is composed of a case 11 having a bottom opening and a bottom cover 14 closing the bottom opening of the case 11. A circuit board 13 carrying a connector case 12 and electronic components thereon is contained in the casing. The case 11, the circuit board 13 and the bottom cover 14 are connected together by screws 15 at four corners of the ECU 10. The case 11 and the bottom cover 14 are made of a metallic plate such as an aluminum or a steel plate by presswork. For explanation purpose, four sides of the ECU 10 are denoted as front, rear, right and left sides, respectively, as shown in FIG. 1. The connector case 12 is exposed to the front side of the ECU 10.

The case 11 has a front opening 21a and three sidewalls 21b, 21c, 21d. Of the three sidewalls, both sidewalls 21b, 21c at the left and right sides are slanted, while the sidewall 21d at the rear side stands upright. Fringe portions 22 are formed at the bottom ends of the sidewalls 21b, 21c. Each fringe portion 22 includes a vertical wall 23 which is bent downwardly from a flat surface of the fringe portion 22. A peripheral size of the bottom opening of the case 11 defined by both vertical walls 23 is a little larger than a peripheral size of the circuit board 13. Flat cylindrical nuts 24 are embedded on the fringe portions 22 at the four corners.

The bottom cover 14 for closing the bottom opening of the case 11 is formed to have the same peripheral size as that of the circuit board 13. The bottom cover 14 includes a bottom plate 31 and a pair of fringe walls 32. The fringe wall 32 is upwardly bent from the bottom plate 31, so that it has a certain height to accommodate the electronic components mounted on the circuit board 13. The circuit board 13 is sandwiched between the fringe portions 22 of the case 11 and the fringe walls 32 of the bottom cover 14 when they are assembled.

The bottom cover 14 also includes a pair of side stays 33 extending to left and right sides thereof. Mounting holes 34 are provided on the side stays 33. The ECU 10 is mounted on the vehicle via separate brackets connected to the side stays 33. The separate brackets can be variously designed according to positions or the space where the ECU 10 is mounted. In this manner, the shape and the size of the side stays 33 are standardized not depending on vehicles on which the ECU 10 is mounted, and the ECU 10 can be easily carried by a conveyer system. It is also possible to directly mount the ECU 10 on the vehicle without using the separate brackets if such is suitable.

Figure 2:
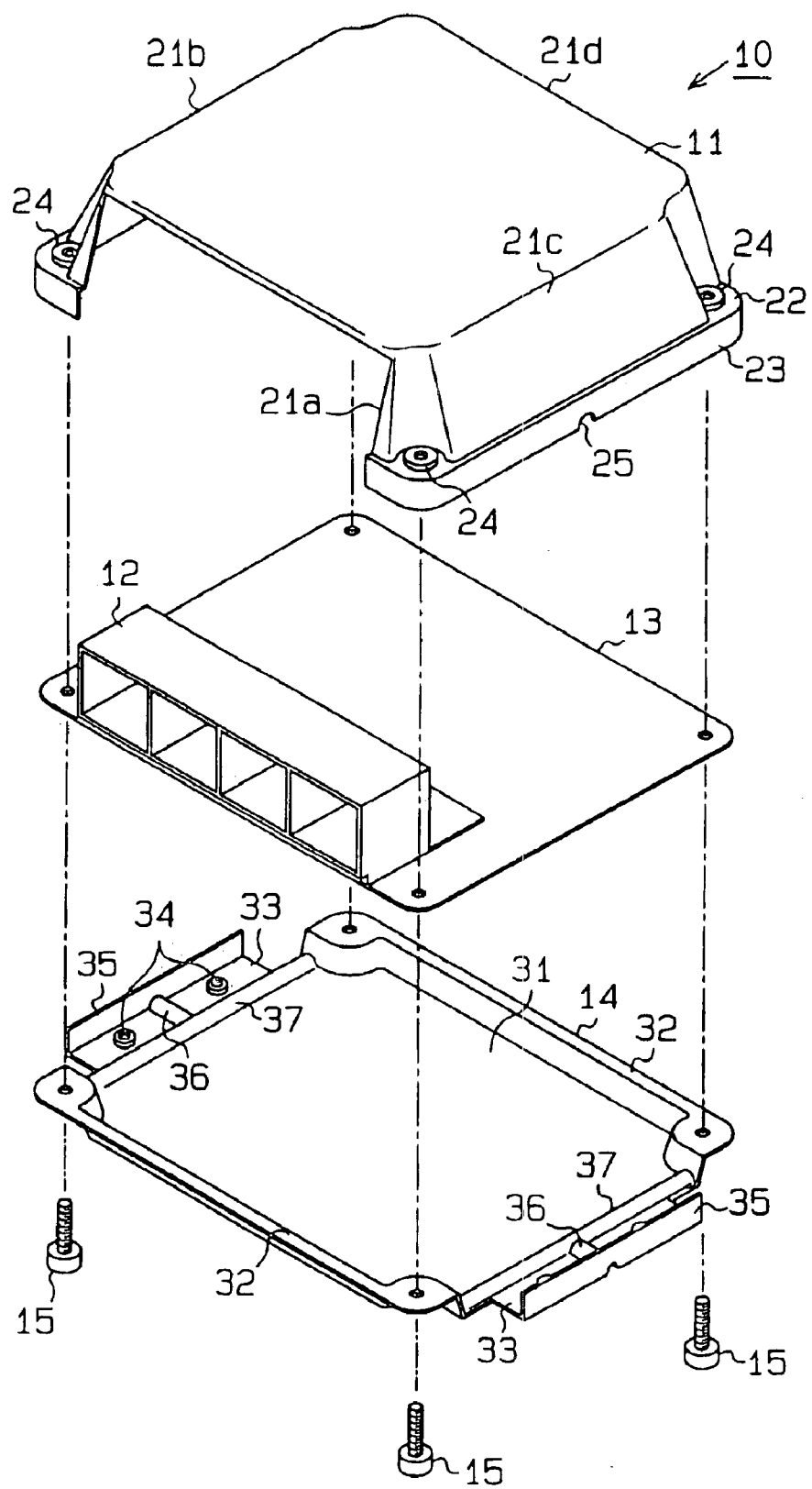
FIG. 2 is a perspective view showing components of the electronic control unit shown in FIG. 1, the components being separated from one another.

The side stay 33 includes a bent portion 35 bent upward with a substantially right angle. The height H (shown in FIG. 3) of the bent portion 35 is determined according to a width of a conveyer passage and the height of the ECU 10, details of which will be explained later referring to FIGS. 3 and 4. A first rib 36 extending from the bottom plate 31 to the side stay 33 is formed on each side stay 33, as shown in FIG. 2. Also, a pair of second ribs 37 are formed along both sides of the bottom plate 31. Both the first and the second ribs 36, 37 are formed in a convex shape having a cross-section such as a half-circular or triangular cross-section. The first rib 36 is perpendicularly connected to the second rib 37 at its center.

A depression 25 is formed at the bottom end of the sidewall 21b, 21c, so that it engages with the first rib 36 when the case 11 and the bottom cover 14 are connected. The shape of the depression 25 is so formed that it corresponds to the convex shape of the first rib 36. Since a pair of the first ribs 36 engage with a pair of depressions 25, the bottom cover 14 is correctly positioned to the case 11 without fail. The first ribs 36 serve to increase mechanical strength of the side stays 33.

Figure 4:
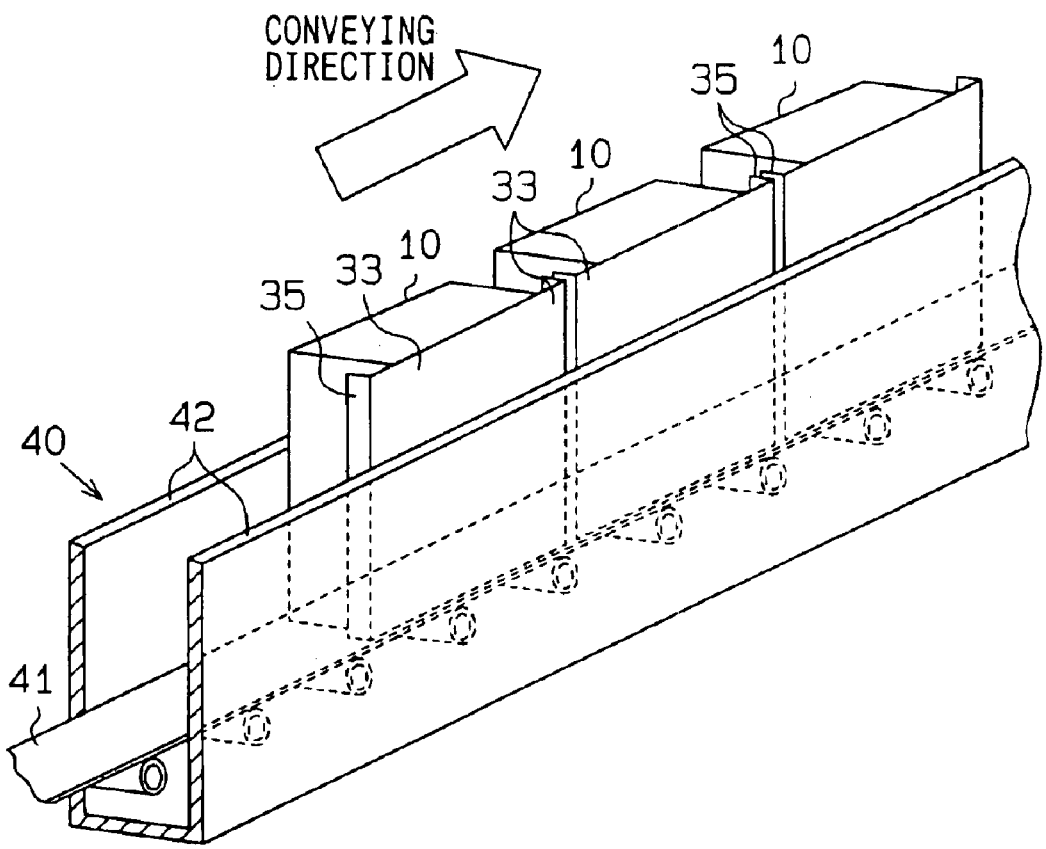
FIG. 4 is a perspective view showing a posture of the electronic control units placed on the conveyer belt.

As shown in FIG. 4, a number of ECUs 10 are carried by a conveyer system having a conveyer passage 40. The conveyer passage 40 is defined by conveyer sidewalls 42, and a conveyer belt 41 runs through the conveyer passage 40. The ECUs 10 are placed on a conveyer belt 41 so that the rear side of each ECU 10 contacts the conveyer belt 41. In other words, the ECUs 10 take standing positions on the conveyer belt 41. The ECUs 10 contact one another at positions where the bent portions 35 are made.

Figure 3:
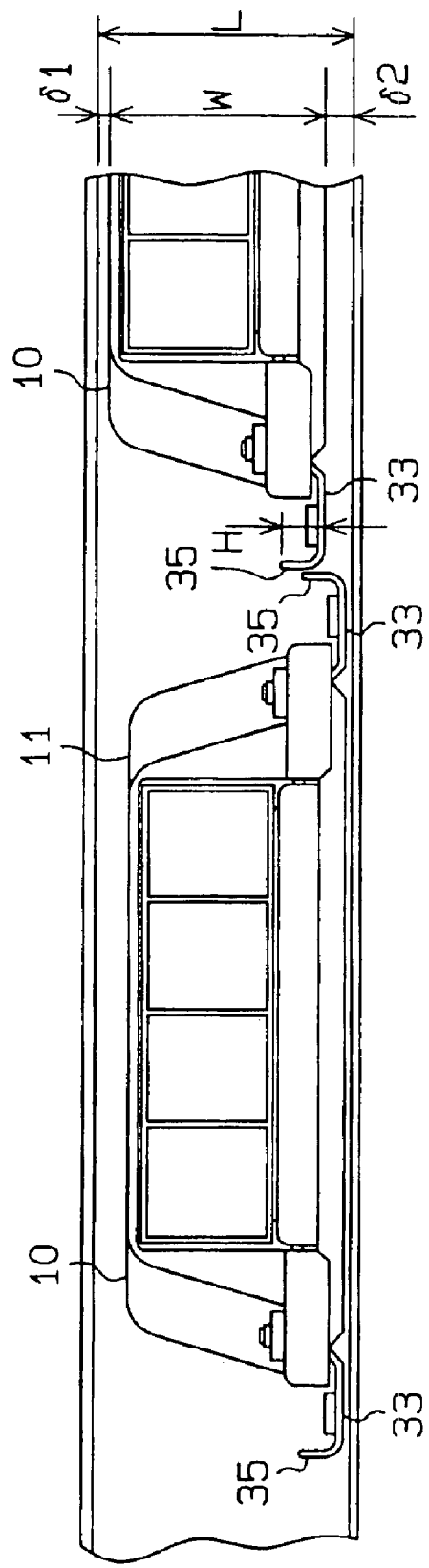
FIG. 3 is a top view showing electronic control units being carried on a conveyer belt.

FIG. 3 shows a top view of the conveyer passage 40. The ECU 10 having its height W is placed in the conveyer passage 40 having its width L. A space $\delta 1$ at one side and another space $\delta 2$ at the other side are formed between the ECU 10 and the conveyer sidewalls 42. The height H of the bent portion 35 is made to satisfy the relation: $H>(L-W)$. In other words, the height H is made larger than $(\delta 1+\delta 2)$. Since the height H of the bent portion 35 is made to satisfy the above dimension, the bent portions 35 do not overlap one another when the ECUs 10 are conveyed in close contact to one another.

Figure 6:
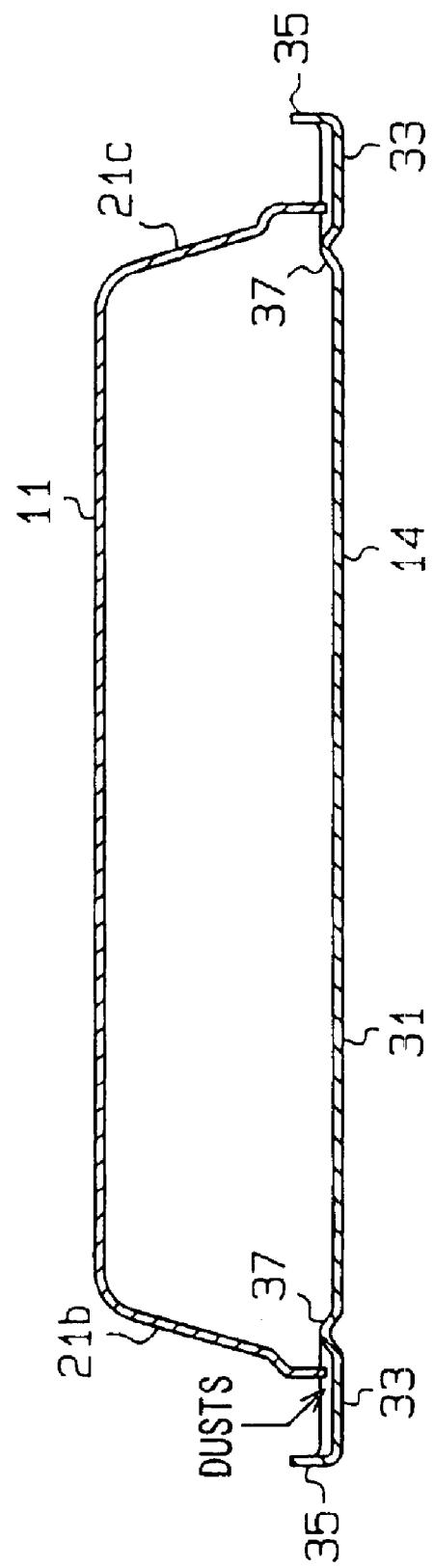
FIG. 6 is a cross-sectional view showing a case and a bottom cover of the electronic control unit, both connected to each other.
Figure 7:
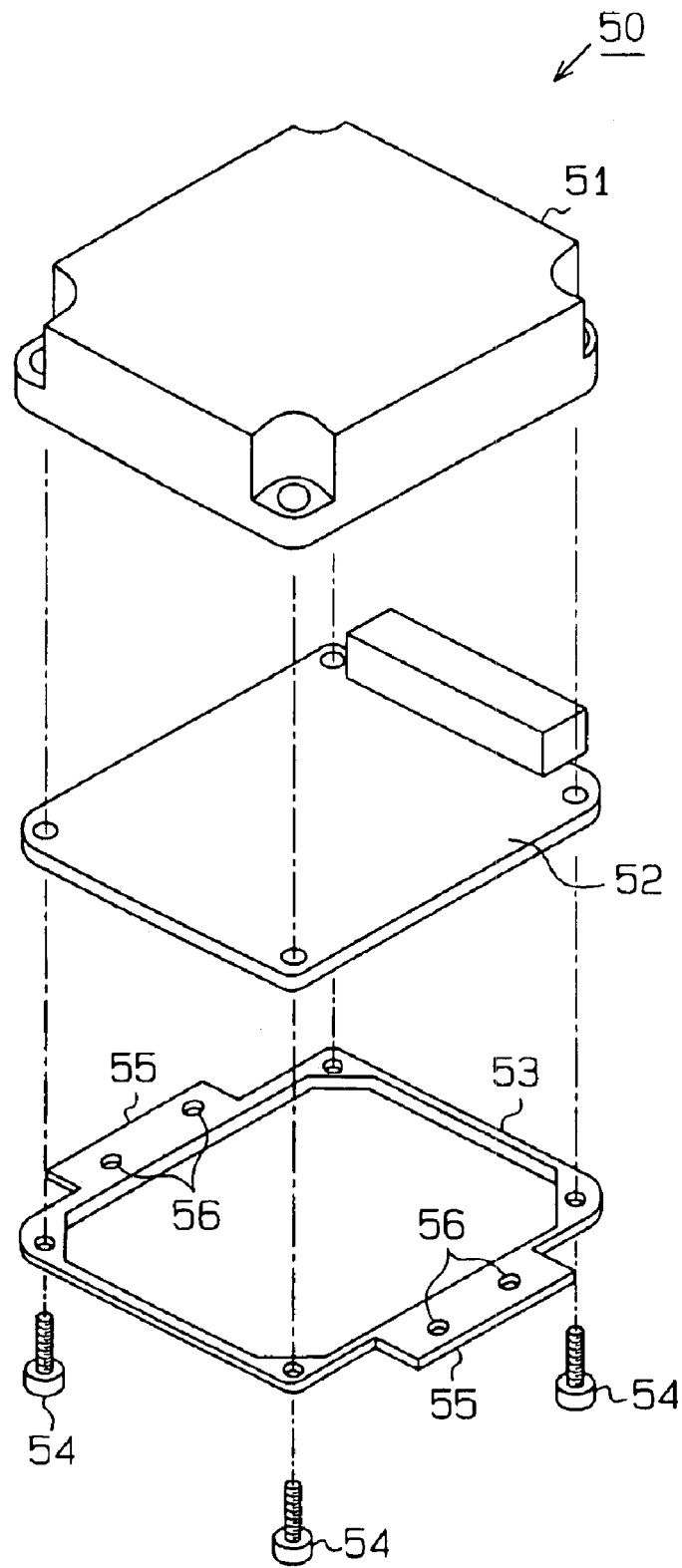
FIG. 7 is a perspective view showing components of a conventional electronic control unit, the components being separated from one another.
Figure 8:
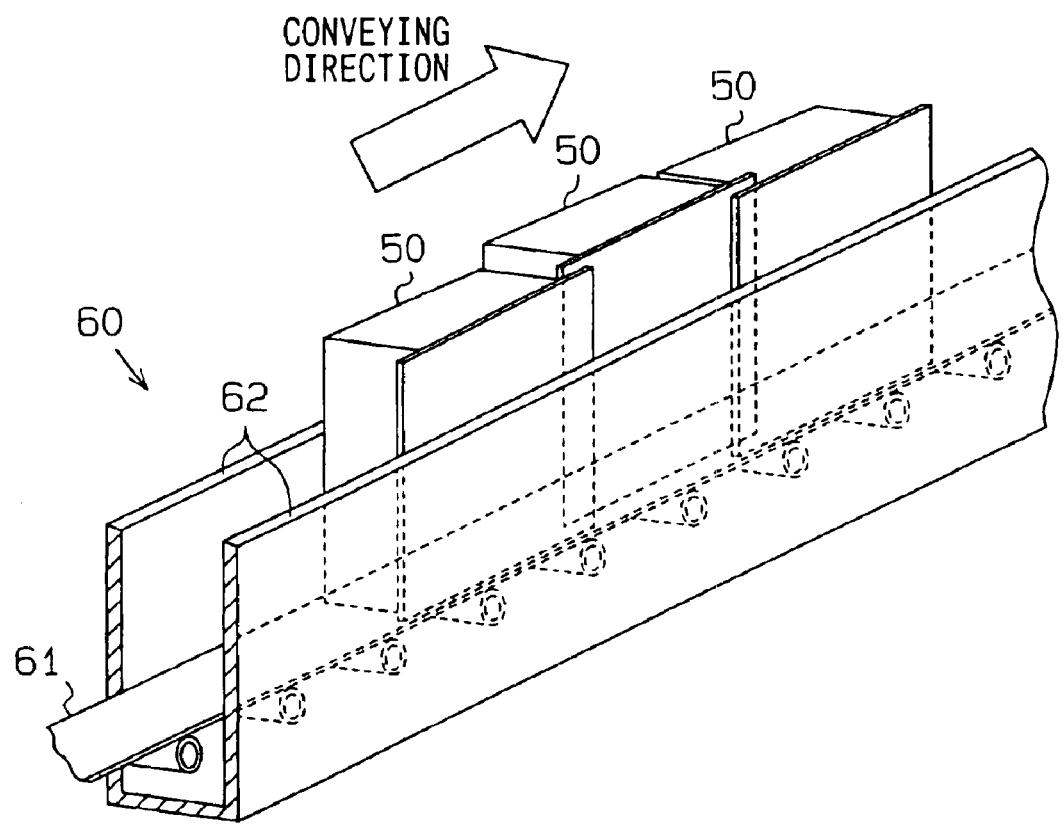
FIG. 8 is a perspective view showing a posture of the conventional electronic control units being carried on a conveyer belt.

The case 11 and the bottom cover 14 are connected to each other as shown in FIG. 6. The second ribs 37 are positioned inside the case 11. Dusts or foreign particles entering into the inside space of the ECU 10 along the flat surface of side stays 33 are blocked by the second ribs 37. If the dusts or foreign particles are electrically conductive, they are very harmful to stable operation of the ECU 10. Those dusts or foreign particles are prevented from entering into the ECU 10 by the second ribs 37.

As described above, since the side stay 33 includes the bent portion 35 having height H which is larger than the difference between width L of the conveyer passage 40 and height W of the ECU 10, the ECUs 10 are smoothly carried by the conveyer system without causing jam or halt. Accordingly, production efficiency is enhanced. Further, the bent portions 35 serve to increase mechanical strength of the side stays 33. The first ribs 36 formed on the side stays 33 further increase the mechanical strength of the side stays 33. Accordingly, the side stays 33 have sufficient strength to endure a high vibrating force of a vehicle. The second ribs 37 formed along both sides of the bottom plate 31 not only increase the mechanical strength of the bottom cover 14 but also serve to prevent dusts or foreign particles from entering into the ECU 10. The first and the second ribs 36, 37 are easily formed by presswork in the process of forming the bottom cover 14.

Figure 5:
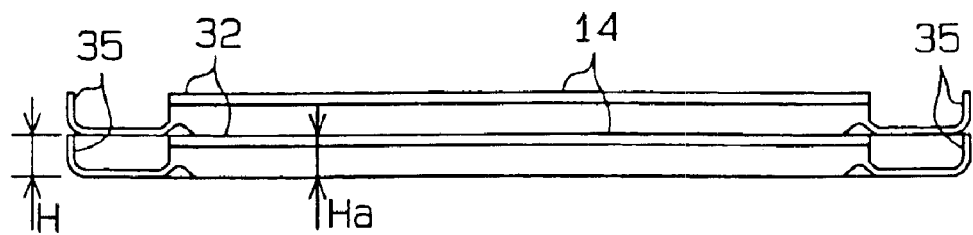
FIG. 5 is a side view showing bottom covers stacked up.

The present invention is not limited to the embodiment described above, but it may be variously modified. For example, the maximum height H of the bent portion 35 may be limited though only the minimum dimension is specified in the foregoing embodiment. As shown in FIG. 5, a number of the bottom covers 14 are stacked in an assembly line of the ECU 10, and they are picked up one by one. It may be difficult to stack the bottom covers 14 if the height H of the bent portion 35 is too large. To overcome this problem, the height H may be limited not to exceed a height Ha of the fringe wall 32. Accordingly, a preferable dimension of the height H may be specified as: (L−W)<H≦Ha.

The ECUs 10 may be carried by the conveyer, placing them on the conveyer belt with a flat posture instead of an upright posture. In this case, too, the bent portions 35 prevent the side stays 33 from overlapping one another on the conveyer belt. Accordingly, an automated arm can correctly pick up the ECU 10.

Though the first ribs 36 are formed on the side stays 33 at the center thereof, the first ribs 36 may be formed at two or more places on each side stay 33. The shape of the first rib 36 is not limited to the convex shape, but it may be formed in a concave shape. When the first rib 36 is formed in a concave shape, the depression 25 formed on the sidewall 21b, 21c has to be changed to a projection that fits the concave shape of the first rib. Though both the first rib 36 and the second rib 37 are formed in the embodiment described above, only the first rib 36 may be made, eliminating the second rib 37.

While the present invention has been shown and described with reference to the foregoing preferred embodiment, it will be apparent to those skilled in the art that changes in form and detail may be made therein without departing from the scope of the invention as defined in the appended claims.

What is claimed is:

1. An electronic control unit to be carried by a conveyer having a conveyer passage, the electronic control unit comprising:
    a substantially box-shaped case having a bottom opening;
    a bottom cover for closing the bottom opening of the case; and
    a circuit board having electronic components mounted thereon, the circuit board being contained in a space formed by the case and the bottom cover, wherein:
    side stays extending to both sides of the bottom cover are formed integrally with the bottom cover, each side stay having a predetermined width suitable for mounting the electronic control unit on a vehicle,
    each side stay includes a bent portion bent from the side stay at a substantially right angle, and
    a height of the bent portion is larger than a difference between a width of the conveyer passage and a height of the electronic control unit.

2. The electronic control unit as in claim 1, wherein: holes for connecting a mounting bracket are formed on the side stay.

3. The electronic control unit as in claim 1, wherein: the bottom cover includes a bottom plate and a pair of fringe walls standing upward from the bottom plate; and the height of the bent portion is smaller than a height of the fringe walls.

4. An electronic control unit to be carried by a conveyer having a conveyer passage, the electronic control unit comprising:
    a substantially box-shaped case having a bottom opening;
    a bottom cover for closing the bottom opening of the case; and
    a circuit board having electronic components mounted thereon, the circuit board being contained in a space formed by the case and the bottom cover, wherein:
    side stays extending to both sides of the bottom cover are formed integrally with the bottom cover, each side stay having a predetermined width suitable for mounting the electronic control unit on a vehicle; and
    each side stay includes a plane perpendicular to the bottom cover, the plane being positioned at an outermost portion of the side stay.

5. The electronic control unit as in claim 4, wherein the plane perpendicular to the bottom cover has a predetermined length that is approximately equal to a corresponding length of the bottom cover.

6. The electronic control unit as in claim 4, wherein the plane perpendicular to the bottom cover has a predetermined length that is less than a corresponding length of the bottom cover.

7. An electronic control unit to be carried by a conveyer having a conveyer passage, the electronic control unit comprising:
    a substantially box-shaped case having a bottom opening;
    a bottom cover for closing the bottom opening of the case; and
    a circuit board having electronic components mounted thereon, the circuit board being contained in a space formed by the case and the bottom cover, wherein
    side stays extending to both sides of the bottom cover are formed integrally with the bottom cover, each side stay having a predetermined width suitable for mounting the electronic control unit on a vehicle,
    each side stay includes a bent portion bent from the side stay at a substantially right angle, and
    each side stay including the bent portion, measured in a direction perpendicular to the width of the side stay, has a predetermined length that is approximately equal to a corresponding length of the bottom cover.

8. An electronic control unit to be carried by a conveyer having a conveyer passage, the electronic control unit comprising:
    a substantially box-shaped case having a bottom opening;
    a bottom cover for closing the bottom opening of the case; and
    a circuit board having electronic components mounted thereon, the circuit board being contained in a space formed by the case and the bottom cover, wherein:
    side stays extending to both sides of the bottom cover are formed integrally with the bottom cover, each side stay having a predetermined width suitable for mounting the electronic control unit on a vehicle; and
    each side stay includes a bent portion bent from the side stay at a substantially right angle, wherein
    each side stay including the bent portion, measured in a direction perpendicular to the width of the side stay, has a predetermined length that is less than a corresponding length of the bottom cover.

9. A method of conveying an electronic control unit by a conveyer having a conveyer passage, the electronic control unit to be carried by a conveyer having a conveyer passage, the electronic control unit including a substantially box-shaped case having a bottom opening, a bottom cover for closing the bottom opening of the case, and a circuit board having electronic components mounted thereon, the circuit board being contained in a space formed by the case and the bottom cover, wherein side stays extending to both sides of the bottom cover are each formed integrally with the bottom cover and have a predetermined width suitable for mounting the electronic control unit on a vehicle, and each of the side stays includes a bent portion bent therefrom at a substantially right angle, the method comprising:

placing a plurality of electronic control units on the conveyer passage so that the bent portion of each electronic control unit faces the bent portion of another electronic control unit; and further comprising preventing overlapping of adjacent ones of the plurality of electronic control units on the conveyor passage by providing the bent portion of each electronic control unit with a predetermined length, measured in a direction perpendicular to the width of the corresponding side stay, that is approximately equal to a corresponding length of the bottom cover.

10. A method of conveying an electronic control unit by a conveyer having a conveyer passage, the electronic control unit to be carried by a conveyer having a conveyer passage, the electronic control unit including a substantially box-shaped case having a bottom opening, a bottom cover for closing the bottom opening of the case, and a circuit board having electronic components mounted thereon, the circuit board being contained in a space formed by the case and the bottom cover, wherein side stays extending to both sides of the bottom cover are each formed integrally with the bottom cover and have a predetermined width suitable for mounting the electronic control unit on a vehicle, and each of the side stays includes a bent portion bent therefrom at a substantially right angle, the method comprising:

placing a plurality of electronic control units on the conveyer passage so that the bent portion of each electronic control unit faces the bent portion of another electronic control unit; and further comprising preventing overlapping of adjacent ones of the plurality of electronic control units on the conveyor passage by providing the bent portion of each electronic control unit with a predetermined length, measured in a direction perpendicular to the width of the corresponding side stay, that is less than a corresponding length of the bottom cover.

* * * * *